United States Patent
Lewis

(10) Patent No.: US 7,532,663 B2
(45) Date of Patent: May 12, 2009

(54) DIGITAL CORRELATORS

(75) Inventor: Jonathan D. Lewis, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 974 days.

(21) Appl. No.: 10/384,574

(22) Filed: Mar. 11, 2003

(65) Prior Publication Data

US 2003/0231705 A1    Dec. 18, 2003

(30) Foreign Application Priority Data

Mar. 12, 2002    (GB) ................. 0205823.8

(51) Int. Cl.
*H04B 1/00* (2006.01)
(52) U.S. Cl. ...................... 375/150; 375/152
(58) Field of Classification Search ............... 375/150, 375/130, 142, 143, 152, 149
See application file for complete search history.

(56) References Cited

U.S. PATENT DOCUMENTS

| | | | | |
|---|---|---|---|---|
| 3,909,784 A | * | 9/1975 | Raymond et al. | 714/812 |
| 5,339,077 A | * | 8/1994 | Venbrux et al. | 341/67 |
| 5,465,405 A | * | 11/1995 | Baseghi et al. | 455/226.4 |
| 5,574,733 A | * | 11/1996 | Kim | 714/728 |
| 5,938,784 A | * | 8/1999 | Kim | 714/733 |
| 6,061,818 A | * | 5/2000 | Touba et al. | 714/739 |
| 6,310,856 B1 | * | 10/2001 | Taipale | 370/208 |
| 6,567,482 B1 | * | 5/2003 | Popovic' | 375/343 |
| 6,577,678 B2 | * | 6/2003 | Scheuermann | 375/222 |
| 6,687,376 B1 | * | 2/2004 | Yamaguchi | 380/46 |
| 6,763,099 B1 | * | 7/2004 | Blink | 379/189 |
| 6,763,363 B1 | * | 7/2004 | Driscoll | 708/252 |
| 6,993,694 B1 | * | 1/2006 | Kapur et al. | 714/733 |
| 7,260,591 B2 | * | 8/2007 | Rajski et al. | 708/252 |
| 2004/0128599 A1 | * | 7/2004 | Rajski et al. | 714/726 |

OTHER PUBLICATIONS

Garrett, D. et al., "Power Reduction Techniques for a Spread Spectrum Based Correlator", Proceedings of the International Symposium on Low Power Electronics and Design, Aug. 1997, pp. 225-230.*

D. Garret, et al., Proceedings of the International Symposium on Low Power Electronics and Design, pp. 225-230, "Power Reduction Techniques for a Spread Spectrum Based Correlator", Aug. 1997.

TSG-RAN WG1 meeting #4, pp. 1-14, "Reduced Complexity Primary and Secondary Synchronisation Codes With Good Aperiodic Correlation Properties for the WCDMA System", Apr. 18-20, 1999.

* cited by examiner

*Primary Examiner*—Emmanuel Bayard
(74) *Attorney, Agent, or Firm*—Oblon, Spivak, McClelland, Maier & Neustadt, P.C.

(57) ABSTRACT

The invention generally relates to improved correlators for spread spectrum receivers, particularly for third generation mobile communications systems.

A Golay correlator with a plurality of delay structures is described. At least one of these delay structures includes a plurality of memory elements sharing a common input bus; and a circular shift register having a plurality of bit positions, one for each of the memory elements, each bit position storing a single bit and having an associated bit position output, each bit position output being coupled to corresponding memory elements for enabling writing of data into the memory element when the bit position output is active; and wherein, in use, only one of the bit positions in the circular shift register is active, the active bit position moving circularly through the shift register to select the memory element into which data on the common bus is written.

16 Claims, 7 Drawing Sheets

DIGITAL CORRELATORS

FIELD OF THE INVENTION

This invention generally relates to signal processing apparatus and methods for digital mobile communications systems, especially third generation (3G) mobile communications systems. More particularly the invention relates to improved correlators for spread spectrum receivers.

BACKGROUND OF THE INVENTION

Third generation mobile phone networks use CDMA (Code Division Multiple Access) spread spectrum signals for communicating across the radio interface between a mobile station and a base station. These 3G networks, (and also so-called 2.5G networks), are encompassed by the International Mobile Telecommunications IMT-2000 standard (www.ituint, hereby incorporated by reference). Third generation technology uses CDMA (Code Division Multiple Access) and the IMT-2000 standard contemplates three main modes of operation, W-CDMA (Wide band CDMA) direct spread FDD (Frequency Division Duplex) in Europe and Japan, CDMA-2000 multicarrier FDD for the USA, and TD-CDMA (Time Division Duplex CDMA) and TD-SCDMA (Time Division Synchronous CDMA) for China.

Collectively the radio access portion of a 3G network is referred to as UTRAN (Universal Terrestrial Radio Access Network) and a network comprising UTRAN access networks is known as a UMTS (Universal Mobile Telecommunications System) network. The UMTS system is the subject of standards produced by the Third Generation Partnership Project (3GPP, 3GPP2), technical specifications for which can be found at www.3gpp.org. These standards include Technical Specifications 23.101, which describes a general UMTS architecture, and 25.101 which describes user and radio transmission and reception (FDD) versions 4.0.0 and 3.2.2 respectively of which are hereby incorporated by reference.

FIG. 1 shows a generic structure of a third generation digital mobile phone system at 10. In FIG. 1 a radio mast 12 is coupled to a base station 14 which in turn is controlled by a base station controller 16. A mobile communications device 18 is shown in two-way communication with base station 14 across a radio or air interface 20, known as a Um interface in GSM (Global Systems for Mobile Communications) networks and GPRS (General Packet Radio Service) networks and a Uu interface in CDMA2000 and W-CDMA networks. Typically at any one time a plurality of mobile devices 18 are attached to a given base station, which includes a plurality of radio transceivers to serve these devices.

Base station controller 16 is coupled, together with a plurality of other base station controllers (not shown) to a mobile switching centre (MSC) 22. A plurality of such MSCs are in turn coupled to a gateway MSC (GMSC) 24 which connects the mobile phone network to the public switched telephone network (PSTN) 26. A home location register (HLR) 28 and a visitor location register (VLR) 30 manage call routing and roaming and other systems (not shown) manage authentication, billing. An operation and maintenance centre (OMC) 29 collects the statistics from network infrastructure elements such as base stations and switches to provide network operators with a high level view of the network's performance. The OMC can be used, for example, to determine how much of the available capacity of the network or parts of the network is being used at different times of day.

The above described network infrastructure essentially manages circuit switched voice connections between a mobile communications device 18 and other mobile devices and/or PSTN 26. So-called 2.5G networks such as GPRS, and 3G networks, add packet data services to the circuit switched voice services. In broad terms a packet control unit (PCU) 32 is added to the base station controller 16 and this is connected to a packet data network such as Internet 38 by means of a hierarchical series of switches. In a GSM-based network these comprise a serving GPRS support node (SGSN) 34 and a gateway GPRS support node (GGSM) 36. It will be appreciated that both in the system of FIG. 1 and in the system described later the functionalities of elements within the network may reside on a single physical node or on separate physical nodes of the system.

Communications between the mobile device 18 and the network infrastructure generally include both data and control signals. The data may comprise digitally encoded voice data or a data modem may be employed to transparently communicate data to and from the mobile device. In a GSM-type network text and other low-bandwidth data may also be sent using the GSM Short Message Service (SMS).

In a 2.5G or 3G network mobile device 18 may provide more than a simple voice connection to another phone. For example mobile device 18 may additionally or alternatively provide access to video and/or multimedia data services, web browsing, e-mail and other data services. Logically mobile device 18 may be considered to comprise a mobile terminal (incorporating a subscriber identity module (SIM) card) with a serial connection to terminal equipment such as a data processor or personal computer. Generally once the mobile device has attached to the network it is "always on" and user data can be transferred transparently between the device and an external data network, for example by means of standard AT commands at the mobile terminal-terminal equipment interface. Where a conventional mobile phone is employed for mobile device 18 a terminal adapter, such as a GSM data card, may be needed.

In a CDMA spread spectrum communication system a baseband signal is spread by mixing it with a pseudorandom spreading sequence of a much higher bit rate (referred to as the chip rate) before modulating the rf carrier. At the receiver the baseband signal is recovered by feeding the received signal and the pseudorandom spreading sequence into a correlator and allowing one to slip past the other until a lock is obtained. Once code lock has been obtained, it is maintained by means of a code tracking loop such as an early-late tracking loop which detects when the input signal is early or late with respect to the spreading sequence and compensates for the change. Alternatively a matched filter may be employed for despreading and synchronisation.

Such a system is described as code division multiplexed as the baseband signal can only be recovered if the initial pseudorandom spreading sequence is known. A spread spectrum communication system allows many transmitters with different spreading sequences all to use the same part of the rf spectrum, a receiver "tuning" to the desired signal by selecting the appropriate spreading sequence.

FIGS. 2a and 2b show, respectively, an exemplary front end 200 and a decoder 250 for a typical spread spectrum receiver. A receiver antenna 202 is connected to an input amplifier 204, which has a second input from an IF oscillator 208 to mix the input of rf signal down to IF. The output of mixer 206 is fed to an IF band pass filter 210 and thence to an AGC (Automatic Gain Control) stage 212. The output of AGC stage 212 provides an input to two mixers 252, 254 to be mixed with quadrature signals from an oscillator 258 and a splitter 256.

This generates quadrature I and Q signals 260, 262 which are digitised by analogue to digital converters 264, which also output a control signal on line 266 to control AGC stage 212 to optimise signal quantisation.

Digitised I and Q signals 268, 270 from ADCs 264 are fed to Nyquist filters 272, 274 and thence to matched filters 276, 278, which are configured to provide a maximum output when a signal with the desired pseudorandom spreading sequence is received. The matched filter outputs feed bit synchronisation circuitry 280 which provides an error signal 286 to a delay locked loop 288 which generates sample clocks 290 to ADCs 266. Circuitry 280 also provides a second output 282 to a demodulator 284 for demodulating received data. Typically, as shown in FIG. 2, the rf signal is digitised at IF although it may be digitised at other points, for example after input amplifier 204.

In a 3G mobile phone system the baseband data is spread using a spreading or channelisation code using an Orthogonal Variable Spreading Factor (OVSF) technique. The OVSF codes allow the spreading factor to be changed whilst maintaining orthogonality between codes of different lengths. To increase the number of simultaneous users of the system the data is further spread by a scrambling code such as a Gold code. The scrambling code does not change the signal bandwidth but allows signals to or from different users to be distinguished from one another, again, because the spreading codes are substantially mutually orthogonal. The scrambling is used on top of the channelisation spreading, that is a signal at the chip rate following OVSF spreading is multiplied by the scrambling code to produce a scrambled code at the same chip rate. The chip rate is thus determined by the channelisation code and, in this system, is unaffected by the subsequent scrambling. Thus the symbol rate for a given chip rate is likewise unaffected by the scrambling.

Different spreading factors and scrambling code links are generally employed for the down link from the base station to the mobile station and for the up link from the mobile station to the base station. Typically the channelisation codes have a length of between 4 chips and 256 chips or, equivalently, a spreading factor of between 4 and 256 (although other spreading factors may be employed). The up link and down link radio (data channel) frames generally last 10 ms, corresponding to a scrambling code length of 38400 chips although shorter frames, for example of 256 chips, are sometimes employed on the up link. A typical chip rate is 3.84 M chips/sec (Mcps), which determines the maximum bit rate for a channel—for example with a spreading factor of 16, that is 16 chips per symbol, this gives a data rate of 240 Kbps. It will be recognised that the foregoing figures are provided merely for the purposes of illustration. Where higher bit rate communications with a mobile station are required more than one such channel may be employed to create a so-called multicode transmission. In a multicode transmission a plurality of data channels are used, effectively in parallel, to increase the overall rate of data transmission to or from a mobile station. Generally the multicode data channels have the same scrambling code but different channelisation codes, albeit preferably with the same spreading factor.

In a 3G mobile phone system there are generally a number of different channels some dedicated to particular users and some common to groups of users such as all the users within a given cell or sector. Traffic is carried on a Dedicated Physical Control Channel (DPCH), or on a plurality of such channels in the case of a multicode transmission, as described above. The common channels generally transport signalling and control information and may also be utilised for the physical layer of the system's radio link. Thus a Common Pilot Channel (CPICH) is provided comprising an unmodulated code channel scrambled with a cell-specific scrambling code to allow channel estimation and equalisation at the mobile station receiver. Similarly a Sychnronisation Channel (SCH) is provided for use by the mobile station to locate network cells. A primary SCH channel is unmodulated and is transmitted using the same channelisation spreading sequence in each cell and does not employ a cell-specific scrambling code. A similar secondary SCH channel is also provided, but with a limited number of spreading sequences. Primary and Secondary Common Control Physical Channel (PCCPCH, SCCPCH) having known channelisation and spreading codes are also provided to carry control information. The foregoing signalling channels (CPICH, SCH and CCPCH) must generally be decoded by all the mobile stations and thus the spreading codes (channelisation codes and where appropriate, scrambling code) will generally be known by the mobile station, for example because the known codes for a network have been stored in the user-end equipment. Here the references to channels are generally references to physical channels and one or more network transport channels may be mapped to such a physical channel. In the context of 3G mobile phone networks the mobile station or mobile device is often referred to as a terminal and in this specification no distinction is drawn between these general terms.

One advantage of spread spectrum systems is that they are relatively insensitive to multipath fading. Multipath fading arises when a signal from a transmitter to a receiver takes two or more different paths and hence two or more versions of the signals arrive at the receiver at different times and interfere with one another. This typically produces a comb-like frequency response and, when a wide band signal is received over a multipath channel, the multiple delays give the multiple components of the received signal the appearance of tines of a rake. The number and position of multipath channels generally changes over time, particularly when the transmitter or receiver is moving. As the skilled person will understand, a correlator in a spread spectrum receiver will tend to lock onto one of the multipath components, normally the direct signal which is the strongest. However a plurality of correlators may be provided to allow the spread spectrum receiver to lock onto a corresponding plurality of separate multipath components of the received signal. Such a spread spectrum receiver is known as a rake receiver and the elements of the receiver comprising the correlators are often referred to as "fingers" of the rake receiver. The separate outputs from each finger of the rake receiver are combined to provide an improved signal to noise ratio (or bit error rate) generally either by weighting each output equally or by estimating weights which maximise the signal to noise ratio of the combined output. This latter technique is known as Maximal Ratio Combining (MRC).

FIG. 3 shows the main components of a typical rake receiver 300. A bank of correlators 302 comprises, in this example, three correlators 302, 302 and 302 each of which receives a CDMA signal from input 304. The correlators are known as the fingers of the rake; in the illustrated example the rake has three fingers. The CDMA signal may be at baseband or at IF (Intermediate Frequency). Each correlator locks to a separate multipath component which is delayed by at least one chip with respect to the other multipath components. More or fewer correlators can be provided according to a quality-cost/complexity trade off. The outputs of all the correlators go to a combiner 306 such as an MRC combiner, which adds the outputs in a weighted sum, generally giving greater weight to the stronger signals. The weighting may be determined based upon signal strength before or after correlation, according to conventional algorithms. The combined signal is then fed to a discriminator 308 which makes a decision as to whether a bit is a 1 or a 0 and provides a baseband output. The discriminator may include additional filtering, integration or other processing. The rake receiver 300 may be implemented in either hardware or software or a mixture of both.

Referring now to FIG. 4, this shows in more detail an example of W-CDMA rake receiver 400 according to the prior art. The receiver 400 has an antenna 402 to receive the spread spectrum signal for the DPCH (Dedicated Physical Data Channel), PCCPCH, and CPICH channels. The signal received by antenna 402 is input to a down converter 404 which down converts the signal to either IF (Intermediate Frequency) or base band for despreading. Typically at this point the signal will be digitised by an analogue-to-digital converter for processing in the digital domain by either dedicated or programmable digital signal processors. To preserve both magnitude and phase information the signal normally comprises I and Q channels although for simplicity these are not shown in FIG. 4. In this receiver, and generally in the receiver's described below, the signal processing in either the analogue or the digital domain or in both domains may be employed. However since normally much of the processing is carried out digitally the functional element drawn as blocks in FIG. 4 will generally be implemented by appropriate software or, where specialised integrated circuits are available for some of the functions, by appropriately programming registers in these integrated circuits to configure their architectural and/or functionality for performing the required functions.

Referring again to FIG. 4, the receiver 400 comprises 3 rake fingers 406, 408 and 410 each having an output to rake combiner 412 which provides a combined demodulated signal output 414 for further processing in the mobile terminal. The main elements of each rake finger correspond and, for simplicity, only the elements of rake finger 406 are shown.

A code tracker 416 is coupled to the input of rake finger 406 to track the spread spectrum codes for despreading. Conventional means such as a matched filter or an early-late tracking loop may be employed for code tracker 416 and since the DPCH, PCCPCH and CPICH channels are generally synchronised the code tracker 416 need only log on to one of these signals but normally CPICH because this generally has a relatively high signal level. The output of the code tracker 416 controls code generators for PCCPCH 418, CPICH 420, and DPCH 422 which generate spreading codes for cross-correlation with their corresponding channel signals to despread the spread spectrum signals. Thus three despreaders 424, 426, 428 are provided, each coupled to the rake finger input, and each receiving an output from one of the code generators 418 420, 422 to despread the appropriate signal (both channelisation and scrambling codes). As the skilled person would appreciate these despreaders will generally comprise a cross-correlator such as a multiplier and summer.

The CPICH pilot signal is unmodulated so that when it is despread the result is a signal with a magnitude and phase corresponding to the attenuation and phase shift of the multipath channel through which the CPICH signal locked onto by the finger of the rake receiver has been transmitted. This signal thus comprises a channel estimate for the CPICH channel, in particular for the multipath component of this channel the rake finger has despread. The estimate may be used without further processing but, preferably the estimate is averaged over time, over one or more symbol intervals, to reduce noise on the estimate and increase its accuracy. This function is performed by channel estimate 430. It will be appreciated although averaging over a long period will reduce the level of noise, this will also reduce the ability of the receiver to respond quickly to changing channel conditions such as are encountered when, for example, the receiver is operating in a terminal in a car on a motorway.

The channel estimate is conjugated to invert the phase and if necessary normalised so that zero attenuation corresponds to a magnitude of unity, and in this form the conjugated signal can simply be used to multiply another received signal to apply or compensate for the channel estimate. Thus multipliers 432 and 434 apply the channel estimate from channel estimate block 430 to the broadcast control channel PCCPCH and to the desired data channel DPCH respectively. The desired data channels are then combined by rake combiner 412 in any conventional fashion and the broadcast channel outputs from each finger, such as broadcast channel output 436 from rake finger 406, are also combined in a second rake combiner (not shown in FIG. 4) to output a demodulated PCCPCH control channel signal.

To perform initial synchronisation in a W-CDMA mobile telecommunications system a matched filter is used to identify the timing offset of a known synchronisation sequence. This matched filter can be efficiently implemented using a Golay correlator 500 as shown in FIG. 5. The structure and operation of such a Golay correlator is described in more detail in 3GPP technical document Tdoc TSGR1#4(99)373 (TSGRAN WG1 Meeting #4 Yokohama Japan, 18-20, Apr. 1999) and in particular-in sections 2.0 to 2.3, which are hereby incorporated by reference.

The Golay correlator of FIG. 5 provides an efficient matched filter for correlating to primary and secondary synchronisation code words based upon Golay sequences and is sometimes called an Efficient Golay Correlator. The filter 500 comprises a plurality of delay lines 502a-502h each with $D_n$ memory elements to provide an n unit delay, typically an n-clock cycle delay. The correlator further comprises a plurality of adders 504 and substractors 506 and provides an output signal on line 508. Such a Golay correlator may be implemented in either hardware or software.

As previously described an rf front end provides incoming data comprising I and Q samples, each generally comprising a plurality of bits. In one common configuration 6 bits are used for each of I and Q, to provide 12 bit wide (complex-valued) data samples. These data samples are applied to an input 510 of Golay correlator 500. As these data traverse the filter the data becomes wider because of the effects of the addition and subtraction operations, as will be understood by those skilled in the art.

One of the main contributions to the power consumption of such a Golay correlator arises from the process of shifting large numbers of bits through each of the many delay lines 502. It is important in mobile communications systems to reduce the power consumption where practicable, particularly at the terminal end as this will generally be battery powered. Background information on power reduction can be found in Garrett D and Stanm, "Power Reduction Techniques for a Spread Spectrum based Correlator", Proc Int Symp Low Power Electronics and Design, 1997 available from the ACM Digital Library (http://portal.acm.org/portal.cfm). There remains, however, a need for improved techniques, particularly for 3G mobile communications systems, more particularly for 3G mobile phones and terminals.

SUMMARY OF THE INVENTION

According to the present invention there is therefore provided a W-CDMA matched or lattice filter, preferably a Golay correlator, for a spread spectrum receiver, the filter having a plurality of delay structures, at least one said delay structure comprising, a plurality of memory elements sharing a common input bus; and a circular shift register having a plurality of bit positions, one for each of said memory elements, each bit position storing a single bit and having an associated bit position output, each bit position output being coupled to a corresponding one of said memory elements for enabling writing of data into the memory element when the bit position output is active; and wherein, in use, only one of the bit positions in said circular shift register is active, the active bit position moving circularly through the shift register to select the memory element into which data on the common bus is written.

The filter or Golay correlator has a reduced amount of data shifting through the delay structures of the filter which, in turn, enables a reduction in power consumption as compared with conventional filters or Golay correlators. The delay structure also, in embodiments, allows the correlator to be implemented using a smaller area of silicon than conventional designs and thus allows a reduction in silicon cost. By employing a so-called one-hot circular shift register, that is a shift register with only a single bit active (either high or low logic level) at any one time, the power consumption of this pointer is reduced. Furthermore by enabling only one of the memory elements for writing, and leaving the data in the other memory elements unchanged, there is a substantial reduction in the number of data transitions at any one time, and hence in the power consumption.

Preferably each of the bit position outputs is coupled to a memory element output enable or chip enable line rather than to, for example, a write enable line. In this way unused memory element outputs may be tristated, providing a further power saving. The skilled person will understand, however, that one of the memory elements stores a signal sample of the required delay and this output should therefore not be tristated.

By reading from the memory element pointed to by the hot bit of the circular shift register before writing in new data a delay corresponding to the length of the circular shift register is obtained. Alternatively, a second one-hot circular shift register may be used as a pointer to a memory element read position or data may be read at a fixed offset from the write position.

It will be appreciated that the input bus for the memory elements should have sufficient width for the I (and Q) samples, although in some applications it may only be one bit wide.

To achieve a yet further reduction in power consumption the one-hot shift register may be shared between two or more of the delay structures. Thus two pluralities of memory elements may be provided, with two separate input buses, but controlled by a single circular shift register. Where the delay structures have lengths in a constant ratio, for example lengths which are powers of two, when a complete count has been made of the memory elements of one delay structure, an integral number of complete counts will have been made of the memory elements of a second delay structure with a smaller number of memory elements.

A single circular shift register may be shared between two or more delay structures in this way by ORing together bit position outputs from the register. Advantageously this may be achieved by providing a register with open-collector (or open-drain) outputs so that a wired-OR gate may be constructed. The skilled person will understand that such an arrangement may be applied in the context of either positive or negative logic, that is where signals are either active high or active low.

The Golay correlator may incorporate means to adapt to different over-sampling rates, by switching delays in and out of the Golay correlator, or by selecting delay structures for use in a correlator, or by selecting a delay provided by a delay structure, in embodiments by selecting or adjusting the length of the circular shift register. For example, an over-sampling rate of two requires each delay element to be doubled and thus, delays chosen from a set of delays in powers of two may be switched in and out according to the signal over-sampling rate.

The Golay correlator may be incorporated within a microprocessor to enhance the instruction set, for example by providing single-instruction correlation operations, and/or to provide hardware acceleration of correlation-type operations.

According to a second aspect of the invention there is provided a correlator for a spread spectrum receiver, the correlator having a plurality of delay structures, a first of said delay structures comprising a first plurality of memory elements having a first input bus, a second of said delay structures comprising a second plurality of memory elements having a second input bus, the correlator further comprising, a common circular one-hot shift register, coupled to the first plurality of memory elements for enabling writing to each of said first memory elements in rotation, and coupled to the second plurality of memory elements for enabling writing to each of said second memory elements in rotation.

The invention also provides a complementary method of implementing a signal delay for a Golay correlator, the method comprising, using a plurality of memory elements sharing a common input bus to provide storage for delaying said signal; and using a circular one-hot shift register to select, for successive samples of said signal, successive memory elements into which to write said samples.

The invention further provides code and a carrier medium carrying processor control code to implement the above described correlators and methods. This processor control code may comprise computer program code, for example to control a digital signal processor or an ASIC. The carrier may comprise a data carrier or storage medium such as a hard or floppy disk, CD- or DVD-ROM, or a programmed memory such as a read-only memory, or an optical or electrical signal carrier. As the skilled person will appreciate the control code may be also be distributed between a plurality of coupled components, for example over a network. The skilled person will further recognise that the invention may be implemented by a combination of dedicated hardware and functions implemented in software.

BRIEF DESCRIPTION OF THE DRAWINGS

These and other aspects of the invention will now be further described, by way of example only, with reference to the accompanying figures in which.

DETAILED DESCRIPTION

Figure 1:
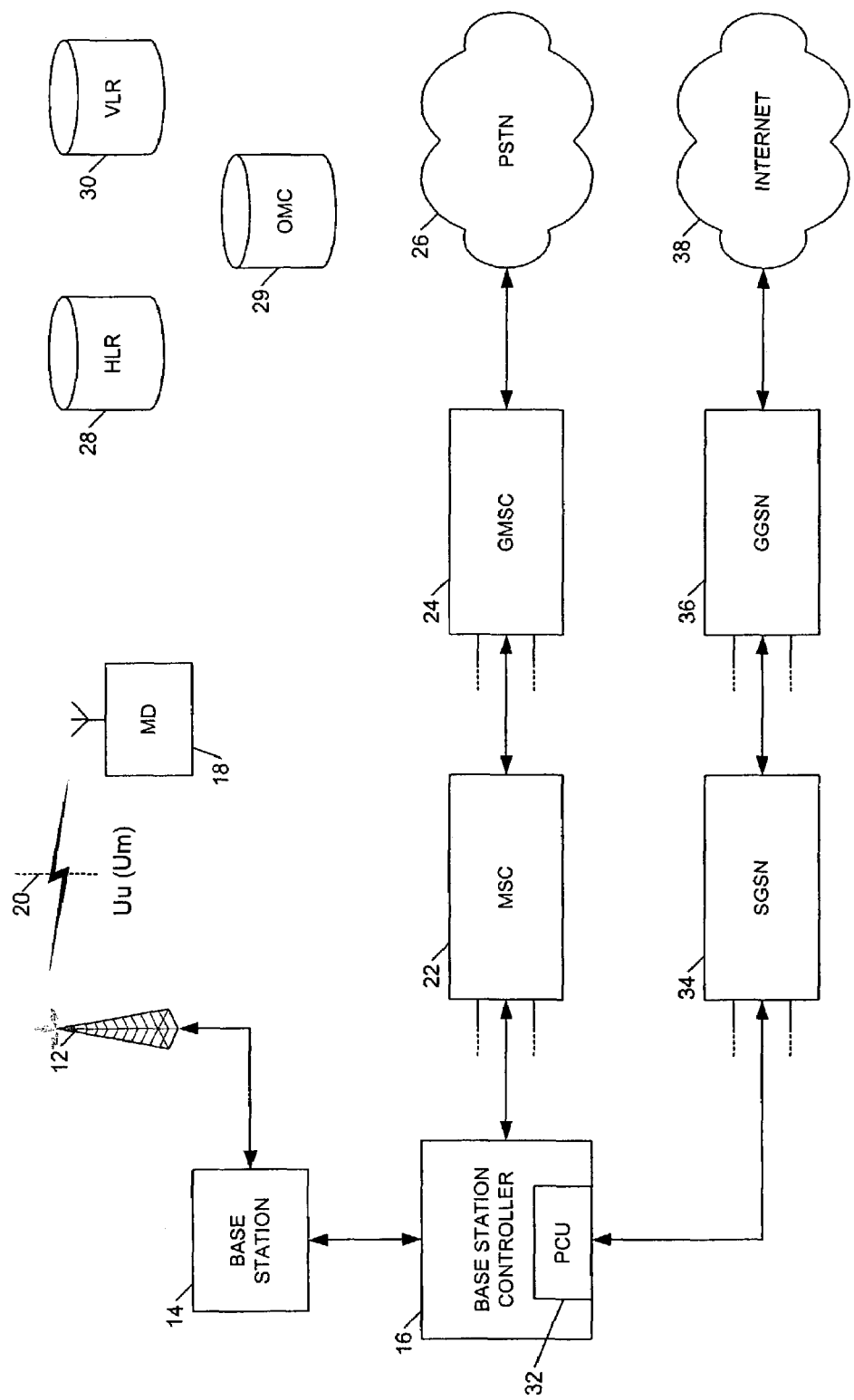
FIG. 1 shows the structure of a generic 3G mobile phone system.
Figure 2A:
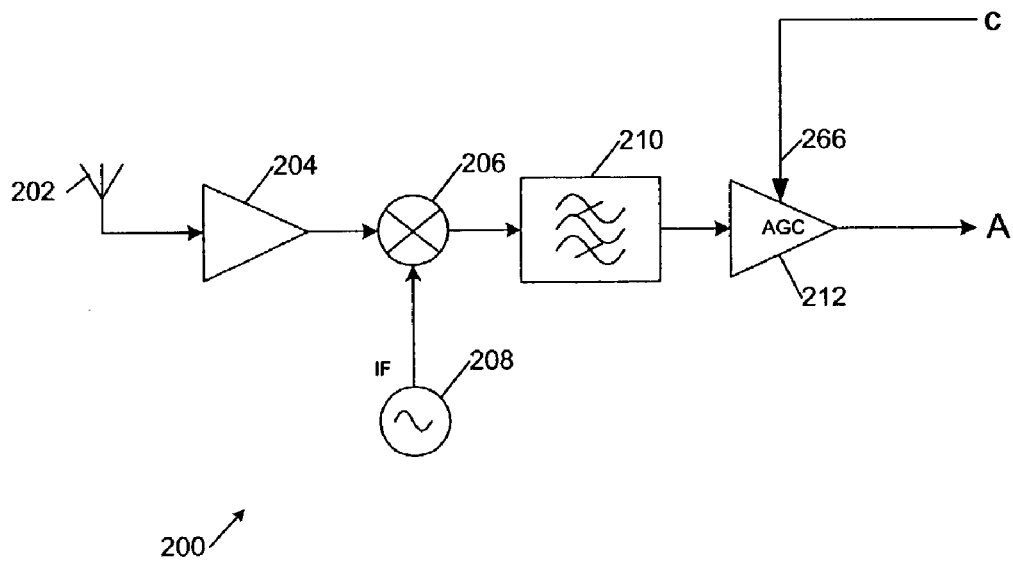
FIGS. 2a and 2b show, respectively, an example of a front end for a spread spectrum receiver, and a spread spectrum decoder according to the prior art.
Figure 2B:
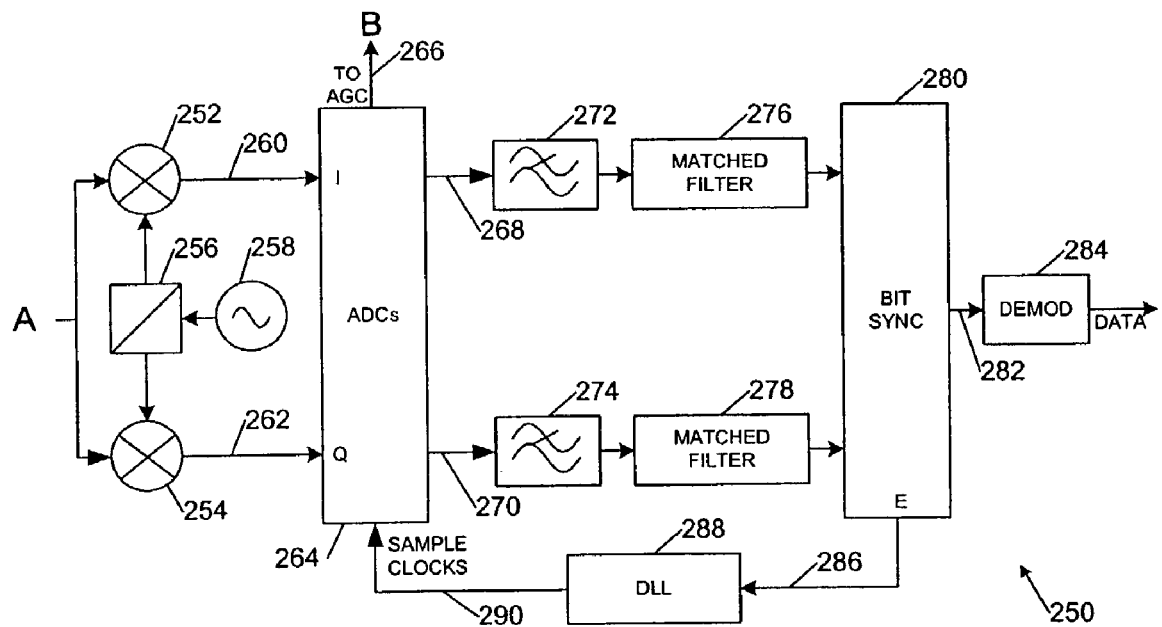
Figure 3:
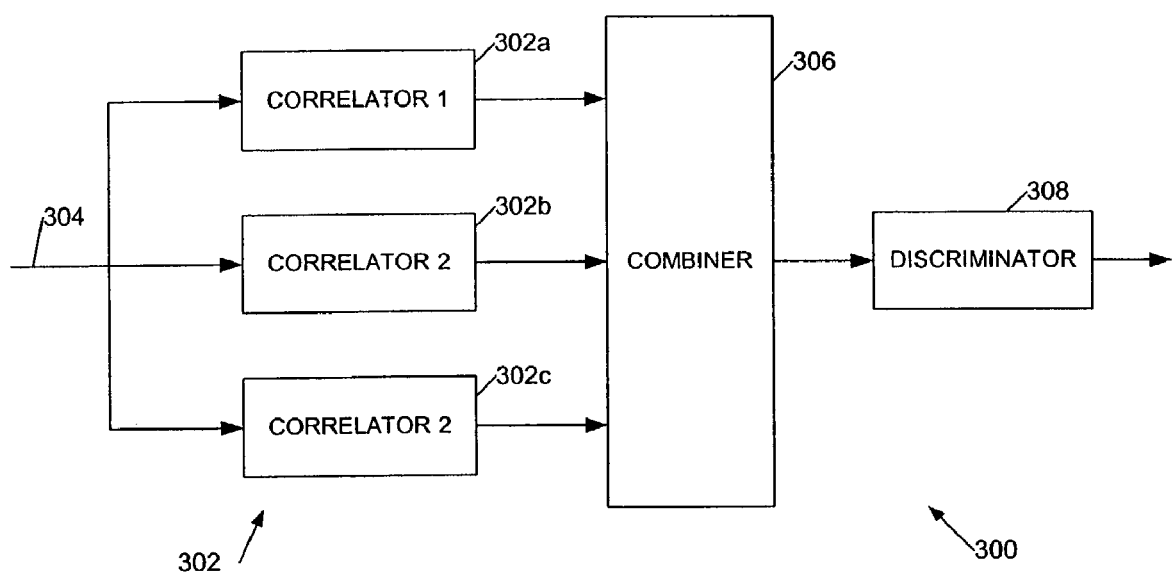
FIG. 3 shows the main elements of a spread spectrum rake receiver.
Figure 4:
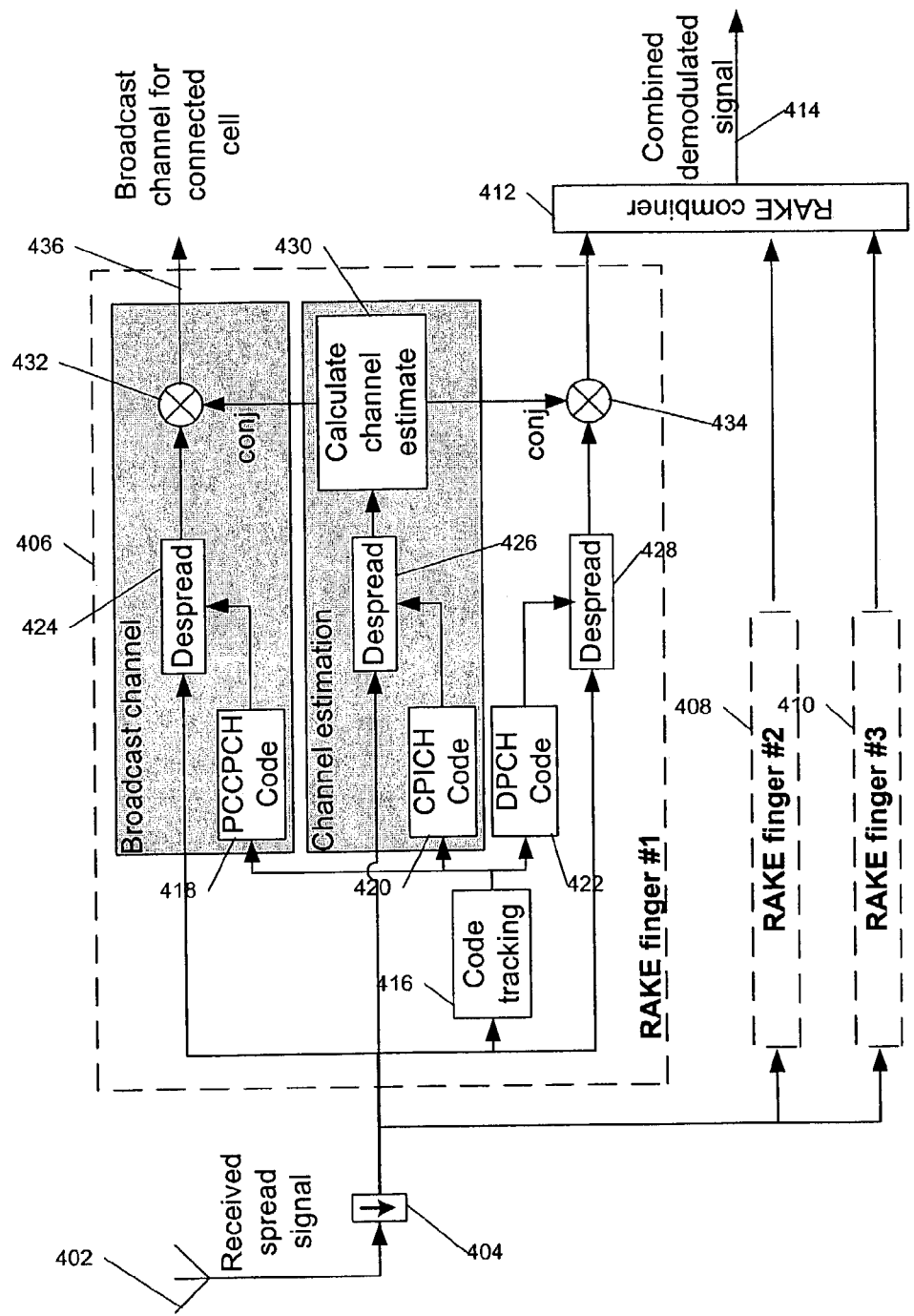
FIG. 4 shows an exemplary W-CDMA rake receiver for a digital mobile phone network.
Figure 5:
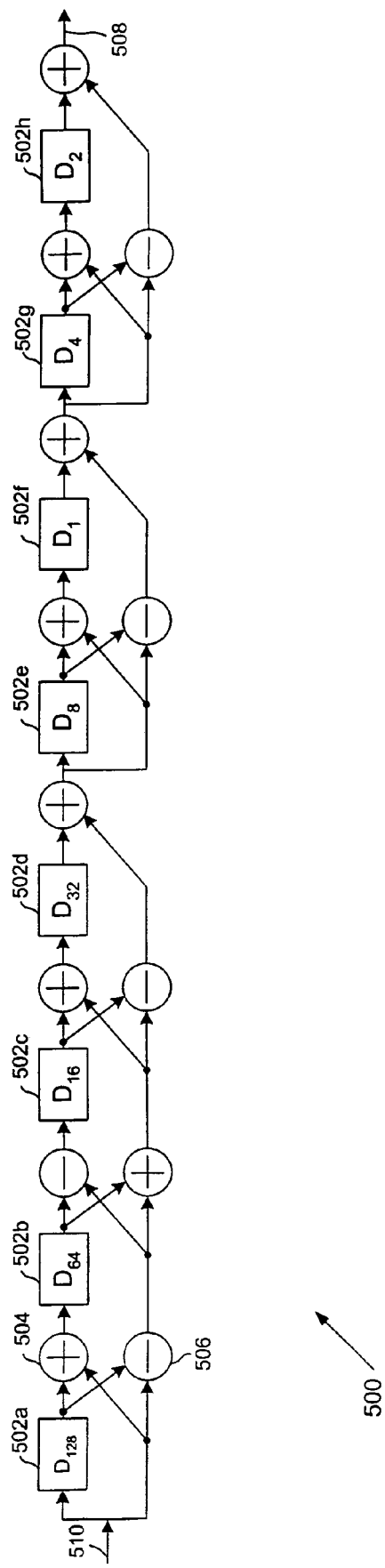
FIG. 5 shows a block diagram of a Golay correlator for a 3G mobile phone system.
Figure 6:
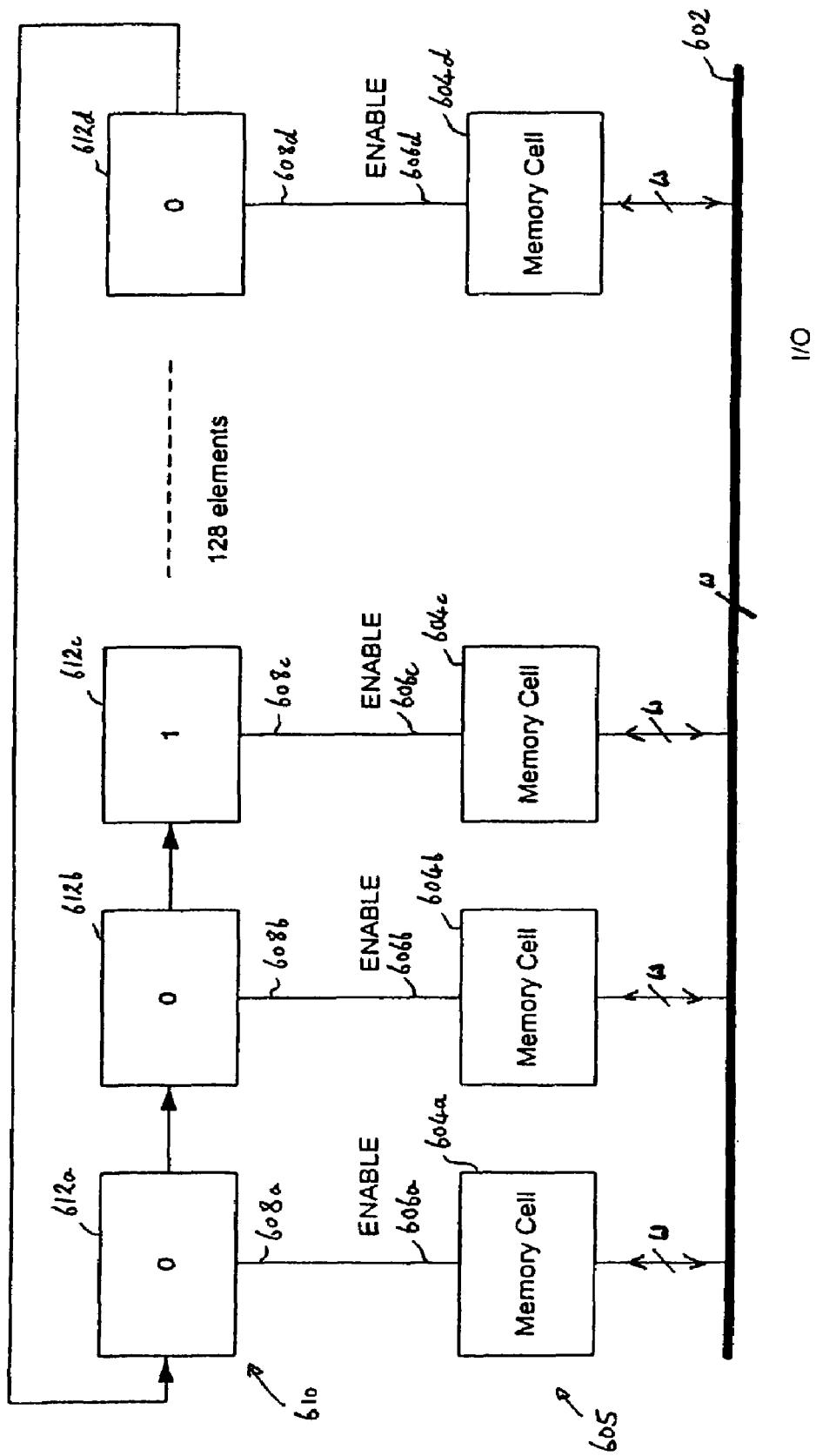
FIG. 6 shows a block diagram of a delay structure for a Golay correlator in accordance with an embodiment of the present invention.

Referring to FIG. 6, this shows a block diagram of a delay structure 600 for use with the Golay correlator 500 of FIG. 5. The delay structure comprises a common input/output bus 602 coupled to a plurality of memory cells 604a-604d of a memory cell array 605. The input/output bus 602 carries input data for writing to a selected one of the memory cells 604, and output data read from one or more of memory cells 604. The width w of the input/output bus 602 is chosen dependent upon the number of bits quantisation of the I and Q signals and upon the position of the delay structure in the overall filter, later positions generally requiring a wider bus than earlier positions. For simplicity the multiplexing arrangements and/or tri-state logic for separating read and write operations is not shown in FIG. 6. It will be appreciated that the input and output functions of bus 602 may be provided on separate buses in other embodiments.

Each of memory cells 604a-d has an enable input 606a-d to enable writing (or reading) to (or from) the corresponding memory cell. Each of these enable lines is driven by a corresponding one bit output 608a-d from a "one-hot" circular shift register 610. This circular shift register comprises a plurality, n, of one-bit storage positions 612a-d only one of which, is active at any one time (as illustrated, storage position 612c has a set bit). Each time the circular shift register 610 is clocked the active bit shifts by one bit position and at the end of the shift register (that is at position 612d) it loops back to the start (that is to position 612a). In the illustrated embodiment n=128 for a delay of 128 clock cycles and w=12 (for six bit I and Q digitisation).

In operation the one-hot shift register enables successive elements 604 of the memory array 605 so that in a clock cycle data is written into (and read from) only one of the memory cells 604. For example in the configuration shown in FIG. 6 memory cell 604c is enabled for writing and thus stores the latest I and Q data sample (although preferably a read-before-write memory access cycle is used to retrieve the overwritten, delayed data sample first). The following memory cell (not shown in FIG. 6), which will be written to next, holds the oldest data sample, that is the data sample with the greatest delay. The delay provided by the delay structure 600 may be varied by varying the length n of the circular shift register 610 or, in other embodiments, by varying an offset between the write and read positions. It will be appreciated that, by contrast with a conventional delay structure, only a single bit is shifted for each incoming sample rather than the n×12 bits that are shifted in a conventional approach.

Figure 7:
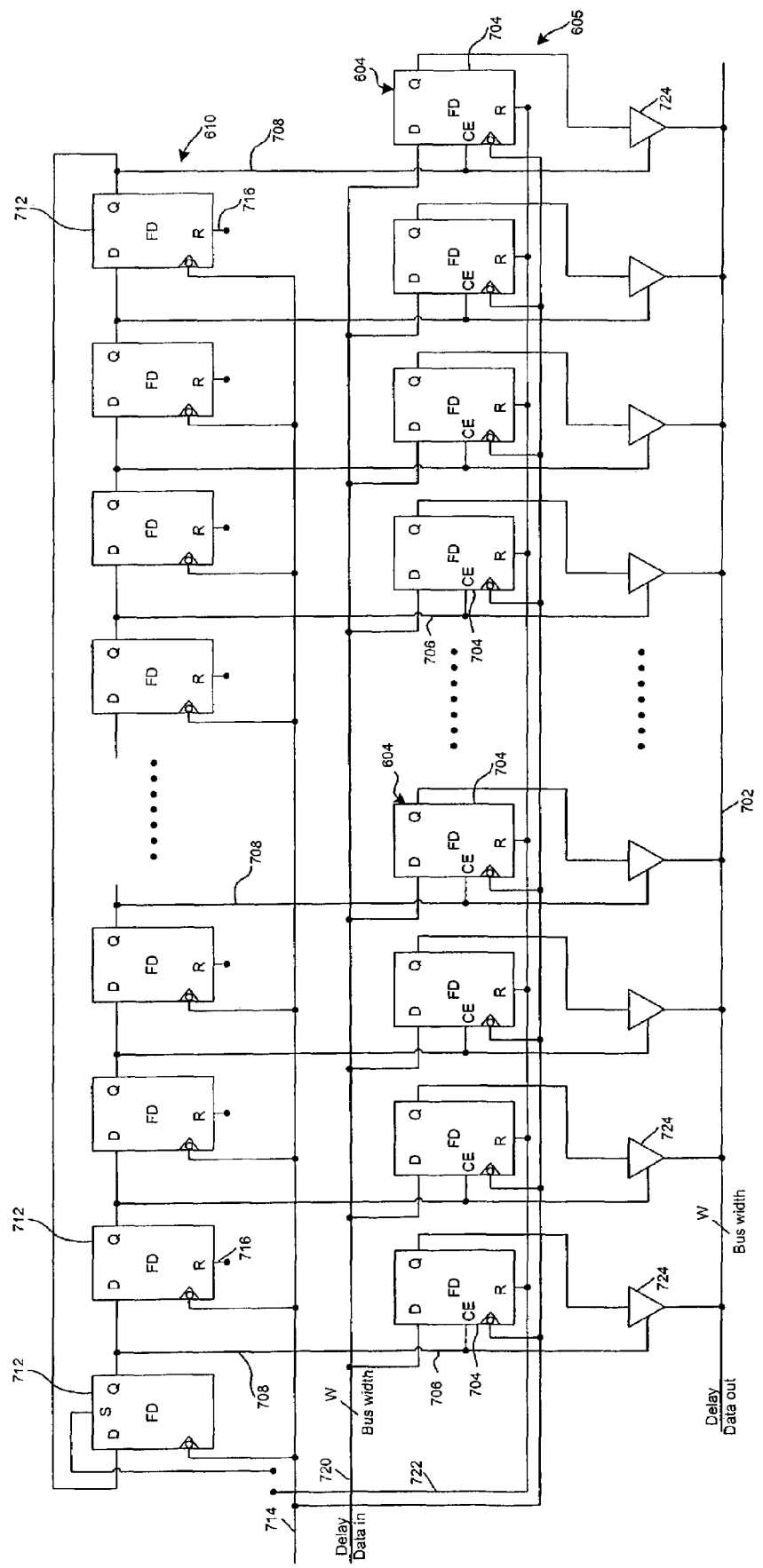
FIG. 7 shows a schematic diagram of a delay structure for a Golay correlator in accordance with an embodiment of the present invention.

FIG. 7 shows a more detailed schematic diagram 700 of one possible implementation of the delay structure 600 of FIG. 6, similar elements being indicated by like reference numerals.

In FIG. 7 the circular shift register 610 comprises a plurality of flip-flops 712 in a looped configuration, with the Q output of one connected to the D input of the next. Data is shifted through the one-hot shift register 610 at transitions on clock line 714. The Q outputs of each flip-flop provide outputs 708 for enabling memory cells 604 of memory cell array 605. All except one of the flip-flops 712 have a reset line 716 tied to ground so that they power up in an inactive state. One of the flip-flops, the left-most in FIG. 7, has a set input 718 tied to ground so that it powers up in an active state. In this way the initial state of circular shift register 610 is set to a one-hot state.

Each of memory cells 604 also comprises a flip-flop 704 with a chip enable (CE) line 706 connected to the corresponding output 708 of shift register 610. Each flip-flop also has a data input D connected to a data input bus 720 and a clock input connected to clock line 714. The reset inputs R of the flip-flops are all tied to a common line 722 which is connected to ground, to ensure that the memory 605 powers up in an all-zero state. Each flip-flop has a Q output connected to a tri-state buffer 724 to selectively provide the data on the Q output to an output databus 702. It will be appreciated flip-flops 712 store only a single bit whilst each flip-flop 704 stores a plurality of bits, w, corresponding to the width of the input and output databuses. The circuit of FIG. 7 operates in a similar manner to that already described with reference to FIG. 6.

A single delay structure has been described in which a one-hot shift register is used to enable successive memory cells. However a Golay correlator of the type shown in FIG. 5 has a plurality of delays, with delay lengths in powers of two. Each delay operates on different data and thus requires a separate memory array, but the positions at which data is written into and read from these separate memory arrays may be determined by a shared one-hot shift register. This can be more easily understood by considering an example where, as in FIG. 5, the maximum delay is 128 clock cycle but delays of 64, 32, 16, 8, 4, 2 and 1 must also be provided. The 64 memory cell delay must write to 64 memory cells before looping back to the start. This function may be derived from a 128 stage circular shift register by ORing together outputs 0 and 64, 1 and 65, 2 and 66 and so on, up to 63 and 127. Thus, for example, the first element in the 64 memory cell array is enabled when the active bit of the one-hot shift register is either in position 0 or in position 64. It can be seen that the same principle may be applied to derive control signals for shorter memory arrays, such as arrays of length 32 or 16.

To derive the control signals for a memory array from a circular one-hot shift register for a longer memory array requires a large number of OR gates. Advantageously these may be implemented using open-collector or open-drain logic. Thus, for example, the output stages of a single circular one-hot shift register may comprise a plurality of open-collector outputs, to facilitate the implementation of wired OR connections by joining together appropriate open collector outputs. It will be appreciated that a set of open-collector output transistors is needed for each memory array the shift register is driving.

A Golay filter or correlator such as that shown in FIG. 5 may employ delays entirely using the above-described one-hot circular shift register implementations. Alternatively some of the delays may be implemented using conventional shift registers, depending upon the power consumption and silicon area trade-offs. The power consumption advantages for small delays are less than those for large delays because less data is being shifted, and the input and output bus connections may occupy a disproportionately large area. Thus it may be advantageous, depending upon whether or not there is an overriding need to reduce power consumption at the expense of silicon area, to implement shorter delays in a conventional manner and longer delays using a one-hot shift register approach as described above. It will also be appreciated that the above-described one-hot shift register approach may also be implemented using software or microcode.

The improved Golay correlator design has applications in mobile terminals and base stations but is particularly suitable for mobile phone baseband chipsets. The correlator may also be used to provide an instruction set enhancement for a microprocessor, such as a digital signal processor, to accelerate Golay correlator processing. Also, as previously mentioned, embodiments of the correlator may enable alteration of an over-sampling rate by switching components of the structure.

The invention has been described with reference to digital mobile phone networks but the skilled person will also appreciate that it has applications in other radio communications systems. No doubt many other effective alternatives will occur to the skilled person and it will be understood that the invention is not limited to the described embodiments and encompasses modifications apparent to those skilled in the art lying within the spirit and scope of the claims appended hereto.

I claim:

1. A Golay correlator for a spread spectrum receiver, the correlator having a plurality of delay structures, at least one said delay structure comprising:
    a plurality of memory elements sharing a common input bus; and
    a circular shift register having a plurality of bit positions, one for each of said memory elements, said circular shift register being shared between at least two of said delay structures, a first delay structure and a second delay structure,
    wherein each bit position stores a single bit and having an associated bit position output, each bit position output being coupled to a corresponding one of said memory elements for enabling writing of data into the memory element when the bit position output is active; and
    wherein, in use, only one of the bit positions in said circular shift register is active, the active bit position moving circularly through the shift register to select the memory element into which data on the common bus is written.

2. A Golay correlator as claimed in claim 1 wherein each said bit position output is coupled to a memory element output enable line of the corresponding memory element.

3. A Golay correlator as claimed in claim 1 wherein said first delay structure has a first plurality, n, of memory elements and said second delay structure has a second plurality, m, of memory elements, and wherein m<n.

4. A Golay correlator as claimed in claim 3 wherein n and m are both integral powers of two, and wherein the correlator is configured to derive an enable signal for each of said second plurality of memory elements by ORing a plurality n/m of bit position outputs of said circular shift register.

5. A Golay correlator as claimed in claim 4 wherein said OR function is implemented using open-collector output or open-drain output logic circuits.

6. A Golay correlator as claimed in claim 1 wherein said circular shift register bit position outputs comprise open-collector or open-drain outputs.

7. A Golay correlator as claimed in claim 1 further comprising means to select delays of said delay element structures to adapt the Golay correlator to an over-sampling rate.

8. A terminal for a mobile communications network incorporating a Golay correlator for a spread spectrum receiver, the correlator having a plurality of delay structures, at least one said delay structure comprising:
    a plurality of memory elements sharing a common input bus; and
    a circular shift register having a plurality of bit positions, one for each of said memory elements, said circular shift register being shared between at least two of said delay structures, a first delay structure and a second delay structure,
    wherein each bit position stores a single bit and having an associated bit position output, each bit position output being coupled to a corresponding one of said memory elements for enabling writing of data into the memory element when the bit position output is active; and
    wherein, in use, only one of the bit positions in said circular shift register is active, the active bit position moving circularly through the shift register to select the memory element into which data on the common bus is written.

9. A Golay correlator for a spread spectrum receiver, the correlator having a plurality of delay structures, a first of said delay structures comprising a first plurality of memory elements having a first input bus, a second of said delay structures comprising a second plurality of memory elements having a second input bus, the correlator further comprising:
    a common circular one-hot shift register, coupled to the first plurality of memory elements for enabling writing to each of said first memory elements in rotation, and coupled to the second plurality of memory elements for enabling writing to each of said second memory elements in rotation.

10. A method of implementing a signal delay for a Golay correlator, the method includes implementing a plurality of signal delays, including first and second signal delays, comprising:
    using a plurality of memory elements sharing a common input bus to provide storage for delaying said signal; and
    using a circular one-hot shift register to select, for successive samples of said signal, successive memory elements into which to write said samples, said circular one-hot shift register being shared between steps to implement said first and second signal delays.

11. A method of implementing a plurality of delays for a plurality of signals for a Golay correlator, the method includes implementing a plurality of signal delays, comprising:
    using a plurality of memory elements sharing a common input bus to provide storage for delaying said signal; and
    using a circular one-hot shift register to select, for successive samples of said signal, successive memory elements into which to write said samples;
    wherein said circular one-hot shift register is used to select memory elements for implementing at least two of the delays.

12. A method as claimed in claim 11 further comprising using open-collector or open-drain outputs to select memory elements for at least one of said delays.

13. A method as claimed in claim 11 further comprising adapting said Golay correlator to an oversampling rate by selecting delay structures for the correlator from a set of delay structures providing delays in powers of two.

14. A method of accelerating a microprocessor implementing a Golay correlator to carry out correlation operation, the method includes implementing a plurality of signal delays, including first and second signal delays, the method, comprising:
    using a plurality of memory elements sharing a common input bus to provide storage for delaying said signal; and
    using a circular one-hot shift register to select, for successive samples of said signal, successive memory elements into which to write said samples, said circular one-hot shift register used in said step being shared between steps to implement said first and second signal delays.

15. A method of synchronizing to a CDMA mobile communication signal, the method, comprising:
    using a Golay correlator to implement a matched filter for synchronizing to the CDMA signal, the Golay correlator including implementations of a plurality of signal delays, including first and second signal delays;

implementing at least one of said signal delays for the Golay correlator by using a plurality of memory elements sharing a common input bus to provide storage for delaying said signal; and using a circular one-hot shift register to select, for successive samples of said signal, successive memory elements into which to write said samples, said circular one-hot shift register being shared between implementations of at least two of said signal delays.

16. A computer readable medium storing computer program instructions for implementing a Golay correlator including a plurality of signal delays, said computer program instructions when executed by a computer system enabling the computer system to perform the steps of:

using a plurality of memory elements sharing a common input bus to provide storage for delaying said signal; and using a circular one-hot shift register to select, for successive samples of said signal, successive memory elements into which to write said samples, said circular one-hot shift register being shared between at least two of said signal delays.

* * * * *